(12) United States Patent
Lin

(10) Patent No.: US 6,755,667 B2
(45) Date of Patent: Jun. 29, 2004

(54) ELECTRONIC COMPONENT HAVING SOLDER BALL RETAINING TERMINAL

(76) Inventor: Chien-Chung Lin, 3F, No. 3, Lane 32, Kuo Feng Chi St., Tao Yuan City (TW)

( * ) Notice: Subject to any disclaimer, the term of this patent is extended or adjusted under 35 U.S.C. 154(b) by 70 days.

(21) Appl. No.: 10/109,700

(22) Filed: Apr. 1, 2002

(65) Prior Publication Data

US 2003/0186571 A1 Oct. 2, 2003

(51) Int. Cl.[7] .............................................. H01R 12/00
(52) U.S. Cl. ........................................................ 439/83
(58) Field of Search .................................. 439/83, 876

(56) References Cited

U.S. PATENT DOCUMENTS 4,071,290 A * 1/1978 DeNigris et al.
6,056,558 A * 5/2000 Lin et al. ....................... 439/83

OTHER PUBLICATIONS

U.S. 2003/0114028, Ohkita 439/83, Jul. 2003.*

* cited by examiner

Primary Examiner—Neil Abrams
(74) Attorney, Agent, or Firm—Rosenberg, Klein & Lee

(57) ABSTRACT

An electronic component and a structure of terminals thereof are proposed. The electronic component includes a plurality of terminals and a plastic main body having a plurality of terminal passageways. A pin portion of the terminal protrudes downwards out of the terminal passageway. The pin portion has a catching portion. A bottom receiving room for placing a tin or solder ball is formed at the bottom end of the terminal passageway. After the pin portion is bent, the catching portion can catch the tin ball from below. The terminal is lengthened to facilitate electroplating. The packaging of tin ball can be accomplished without the electronic component undergoing a soldering procedure. When the electronic component is soldered to a circuit board, the pin portion can be clamped between the tin ball and a conductive copper foil of the circuit board to form a soldered structure of sandwich shape, thereby achieving good electric connection.

11 Claims, 10 Drawing Sheets

ELECTRONIC COMPONENT HAVING SOLDER BALL RETAINING TERMINAL

FIELD OF THE INVENTION

The present invention relates to an electronic component and a structure of terminals thereof and, more particularly, to an electronic component (e.g., a central processing unit (CPU) slot) capable of forming electric connection with circuits on some devices (e.g., computer motherboards) so as to plug with corresponding electronic products (e.g., CPUs) having a plurality of pins. The present invention is characterized in that tin balls can be fixed at predetermined positions without passing through a tin oven, and tin material of the tin balls will not spread upwards when being soldered onto a circuit board. Thereby, nickel can be coated on terminals to prevent tin from spreading upwards, and the heights of the tin balls will be in agreement to facilitate soldering with a circuit board.

BACKGROUND OF THE INVENTION

When electronic products having a plurality of pins are to form electric connection with some devices, electronic components having a plurality of insertion holes (corresponding to the above pins) are generally used. For example, a CPU (an electronic product) having a plurality of pins forms electric connection with a computer motherboard by inserting into a CPU slot (an electronic component).

As shown in FIG. 2, a prior art electronic component 200 comprises a plurality of terminals 1 and a plastic main body 2 having a plurality of corresponding open terminal passageways 21.

Please refer to FIG. 1. Two sides of a main body portion 11 of the terminal 1 are extended to form two symmetric elastic contact pieces 14 to clamp a pin (not shown) of an electronic product. The distal end of the terminal 1 is a pin portion 13 for soldering. A bearing portion 12 is between the main body portion 11 and the pin portion 13. The bearing portion 12 and the pin portion 13 form a terminal pin.

Please refer to FIGS. 1 and 2. The terminal 1 of the conventional electronic component 200 is first bent to let the pin portion 13 be transversal so as to facilitate soldering with a tin ball 15. Before being soldered to the tin ball 15, the terminal 1 with the bent pin portion 13 is installed in the terminal passageway 21 of the plastic main body 2, as shown in FIG. 2. In order to join the tin ball 15 at the bottom face of the pin portion 13 of each of the terminals 1, it is necessary to place the above electronic component 200 upside down and paste soldering-assistant agent on the bottom face of the pin portion 13 of each of the terminals 1. When the electronic component 200 passes through a tin oven, the tin balls 15 placed on the pin portions 13 (as shown in FIG. 3) can be soldered onto the bottom faces of the pin portions 13 of the terminals 1 so as to be soldered to a circuit board (not shown).

For the conventional electronic component 200, when performing the procedures of placing the electronic component upside down, pasting on tin glue, and then passing through the tin oven, it is generally necessary to coat gold, nickel, and tin on the upper, middle, and lower sections of the terminals 1, respectively. The nickel is exploited to prevent tin from spreading to the main body portion 11 or even to the elastic contact pieces 14. However, because the original terminal 1 is too short, the length thereof will be even shorter (about 2–2.5 mm) after the pin portion 13 thereof is bent. It thus is very difficult to respectively coat gold, nickel, and tin. Therefore, the present practice is to totally coat gold. But the tin balls at the bottom end will spread upwards along the terminals 1 coated with gold when they start melting. In addition to the reason that there is no nickel for blockade, there is one reason that the terminal passageways are open so that tin can spread upwards without any blockade.

As shown in FIG. 4, when the tin ball 15 is to be soldered onto the bottom face of the pin portion 13 of each of the terminals 1, the whole terminal 1 will be covered by tin if the temperature control is somewhat improper. The tin ball originally reserved for soldering with a circuit board will thus be drawn away or even disappear. Moreover, because the degree of being drawn away of each tin ball is different, the height of each tin ball will vary so that the bottom face of the electronic component 200 will be uneven. Therefore, it is difficult to place the electronic component 200 onto a circuit board (not shown) for performing soldering.

The above conventional electronic component 200 has the following drawbacks.

1. After finishing the manufacturing of the electronic component 200, it is also necessary to let it pass through a tin oven for fixedly soldering the tin balls 15 onto the bottom ends of the terminals 1 at the bottom end of the electronic component 200.
2. Because the terminal 1 is too short, it is very difficult to coat nickel for blocking tin. Therefore, the tin material will easily spread upwards to the whole terminal 1 or even contaminate the elastic contact pieces 14 when the electronic component passes through a tin oven.
3. The heights of the tin balls 15 at the bottom side of the finished electronic component 200 are different so that it is very difficult to place the electronic component on a circuit board for performing soldering. Moreover, the soldered circuit will be uneven.

SUMMARY OF THE INVENTION

Accordingly, the primary object of the present invention is to provide an electronic component and a structure of terminals thereof. After the electronic component is manufactured, tin balls can be clamped at the bottom end of the electronic component without passing through a tin oven. Besides the tin balls can contact the terminals, the bottom ends thereof are exposed to be soldered to a circuit board. Therefore, the tin balls at the bottom side of the electronic component can be fixed without passing through a tin oven. The length of the terminal is sufficient to be respectively coated with gold, nickel, and tin so as to prevent tin from spreading upwards. Moreover, the heights of the tin balls are in agreement to facilitate soldering with a circuit board and let the soldered circuit board be even.

Another object of the present invention is to provide an electronic component and a structure of terminals thereof, whereby tin balls will not fall off when being pressed into the plastic main body.

Yet another object of the present invention is to provide an electronic component and a structure of terminals thereof, whereby good contact effect can be achieved between tin balls and the terminals.

To achieve the above objects, the present invention provides an electronic component and a structure of terminals thereof. The electronic component comprises a plurality of terminals and a plastic main body having a plurality of terminal passageways. A pin portion of the terminal protrudes downwards out of one of the terminal passageways. The pin portion has also a catching portion of through hole type. The bottom end of the terminal passageway forms a bottom receiving room for receiving a tin ball. After the pin portion of the terminal is bent, the catching portion thereof can catch it from below the tin ball. Because the tin balls have been caught and positioned by the catching portions of the pin portions of the terminals, the tin balls at the bottom side of the electronic component can be fixed without passing through a tin oven. Because of the lengthened pin portion, the length of the whole terminal is sufficient to be respectively coated with gold, nickel, and tin for preventing tin from spreading upwards. Because the tin balls do not pass through a tin oven, the heights thereof can be kept in agreement so that the electronic component can evenly contact a circuit board when it is placed on the circuit board for soldering. Moreover, because the tin material of the tin balls will not spread upwards, the soldered circuit board will be even.

Secondly, the depth of the bottom receiving room at the bottom end of the plastic main body is just larger than the radius of the implanted tin ball, and the bore thereof is just smaller than the diameter of the implanted tin ball. The tin ball is thus fixed by the bottom receiving room in pressing-in way. It is very difficult to take out the tin ball in reverse direction, not mentioning that the tin ball falls off.

Thirdly, the terminal passageway of the plastic main body has a base with one open side. The bottom end of the terminal passageway has the bottom receiving room separated by the base. After the terminal is installed into the terminal passageway, the pin portion of the terminal and a bearing portion between the main body portion and the pin portion will pass through the open side of the terminal passageway so that the bearing portion of the terminal becomes one wall of the bottom receiving room. After the tin ball is pressed into the bottom receiving room and fixed, it can contact the bearing portion of the terminal. Furthermore, because the catching portion catches the tin ball at the periphery thereof, good contact can be achieved between the tin ball and the terminal.

The various objects and advantages of the present invention will be more readily understood from the following detailed description when read in conjunction with the appended drawing, in which:

BRIEF DESCRIPTION OF THE DRAWINGS

FIG. 7B is a cross-sectional view of FIG. 7A after tin balls are pressed in;

DETAILED DESCRIPTION OF THE PREFERRED EMBODIMENTS

Figure 1:
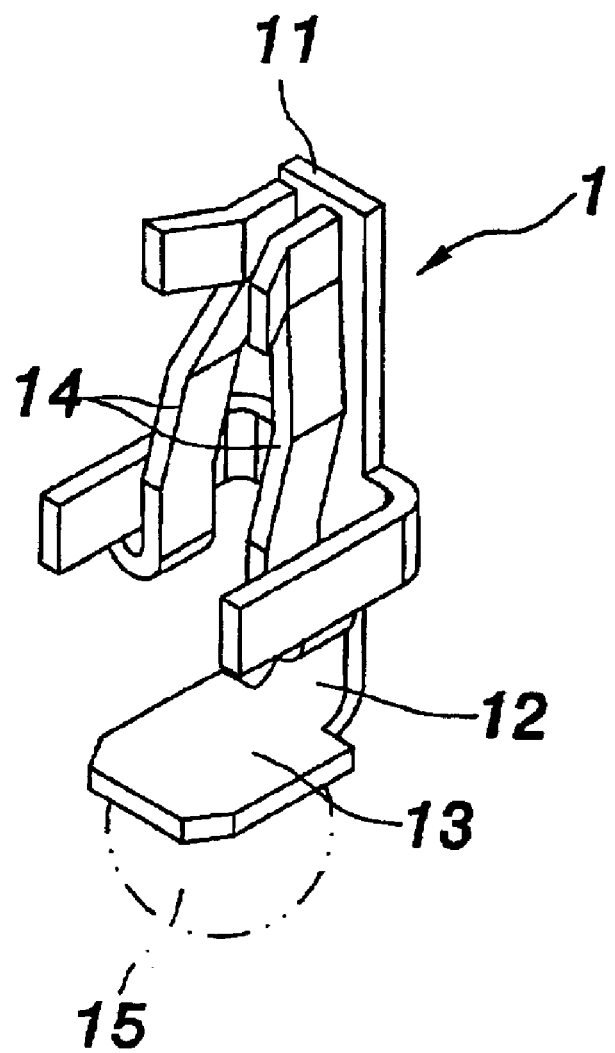
FIG. 1 is a perspective view of a terminal in a prior art electronic component.
Figure 2:
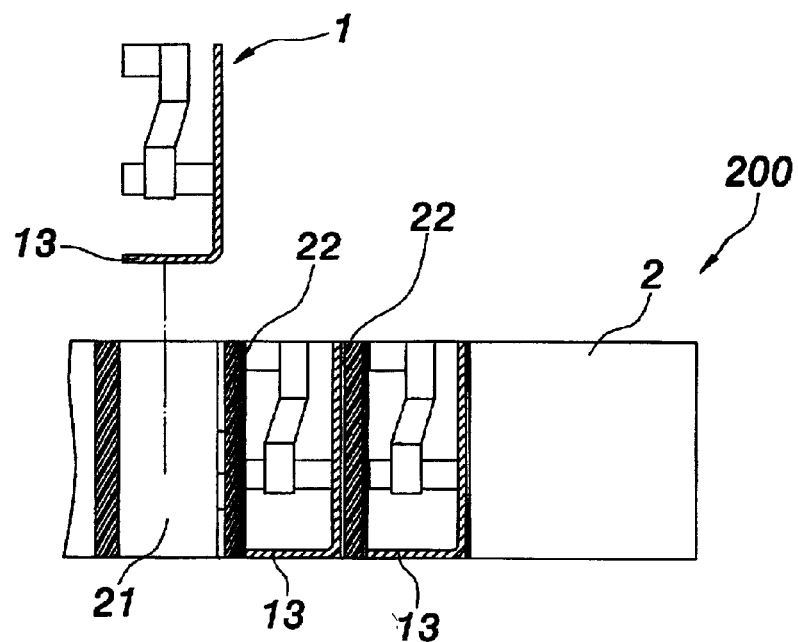
FIG. 2 is an assembly cross-sectional view of a prior art electronic component when it is placed upright and installed with terminals.
Figure 3:
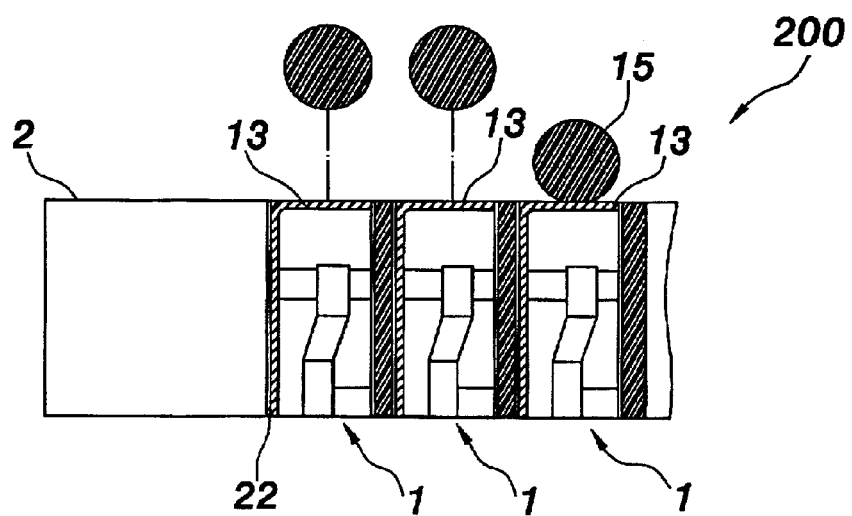
FIG. 3 is an assembly cross-sectional view of a prior art electronic component when it is placed upside down for placing tin balls.
Figure 4:
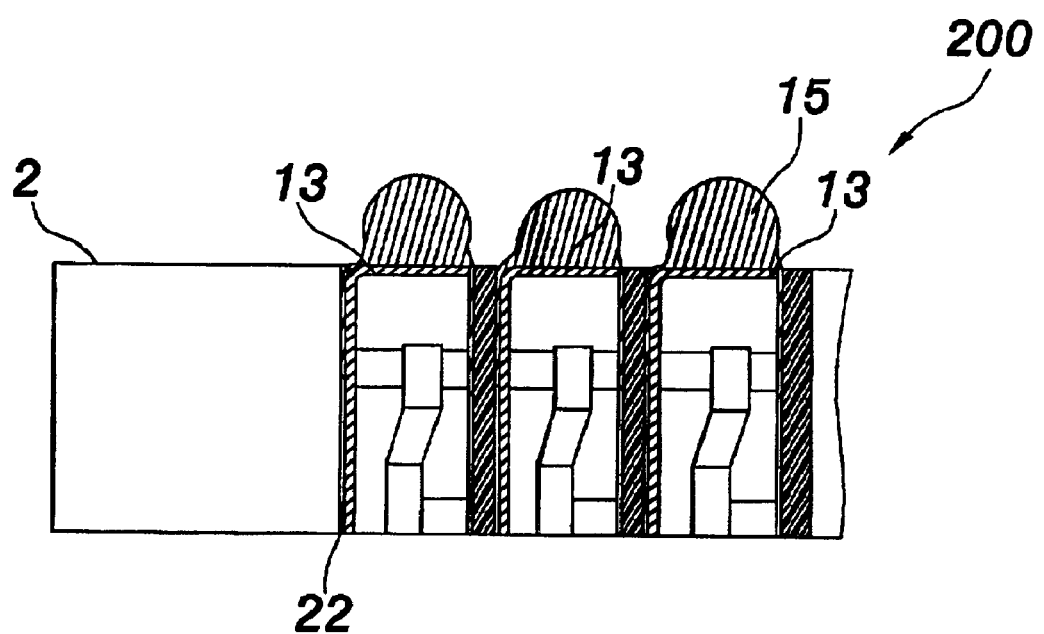
FIG. 4 is a cross-sectional view of a prior art electronic component after passing through a tin oven (Because the degree of being drawn away of each tin ball is different, the height of each tin ball will vary)

As shown in FIG. 7, the present invention provides an electronic component and a structure of terminals thereof. An electronic component 500 of the present invention comprises a plurality of terminals 3 and a plastic main body 5 having a plurality of terminal passageways 51. A tin ball 4 is fixed at the bottom end of each of the terminals 3.

Figure 5:
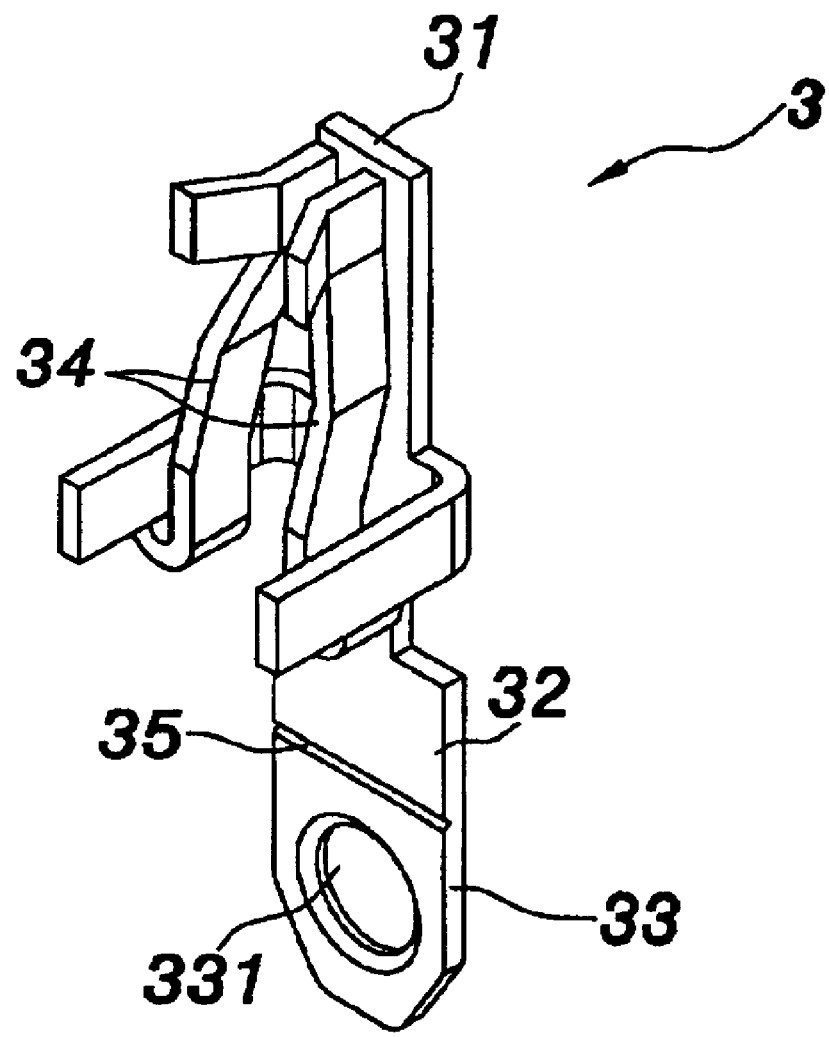
FIG. 5 is a perspective view of a terminal of an electronic component of the present invention.
Figure 6:
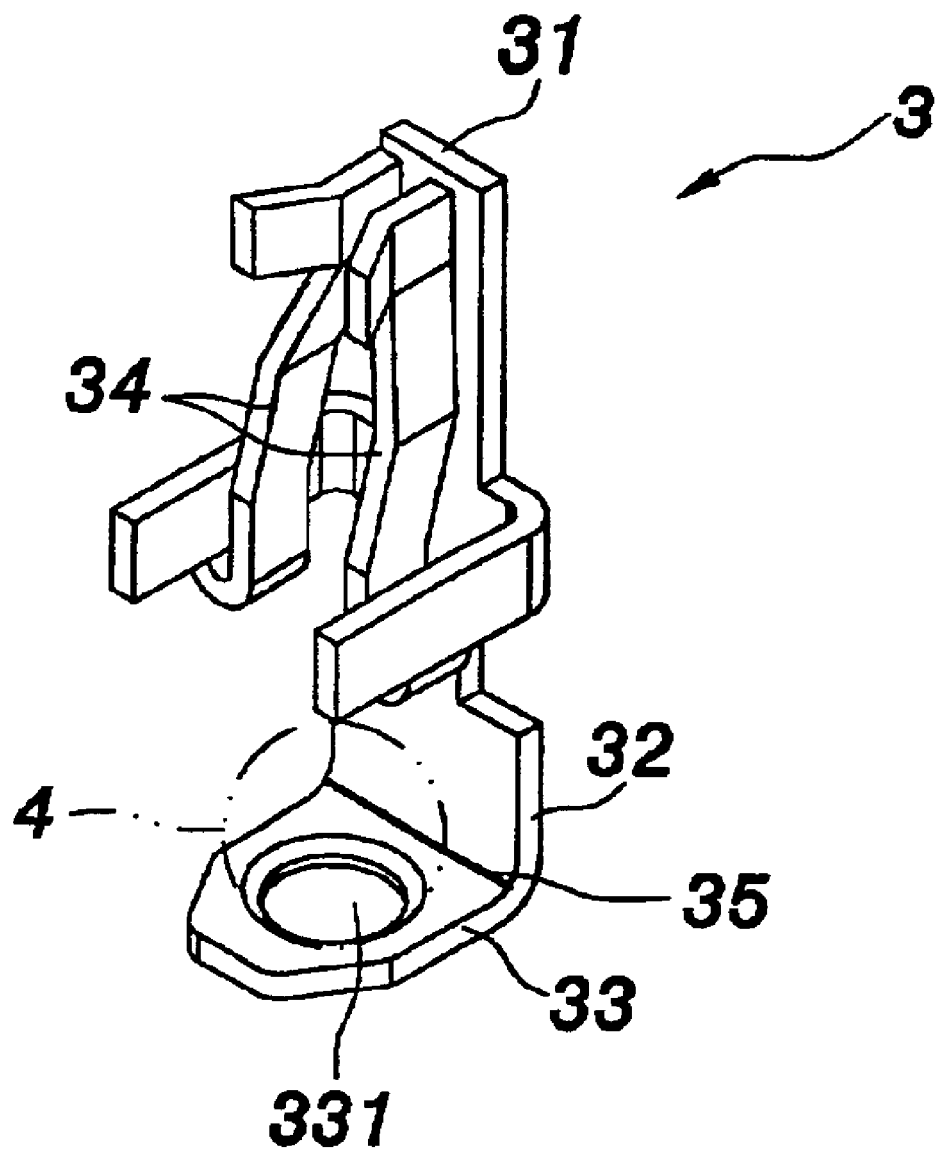
FIG. 6 is a perspective view of a terminal of the present invention after being bent.

As shown in FIGS. 5 and 6, two sides of a main body portion 31 of the terminal 3 are extended forwards to form two symmetric elastic contact pieces 34. The distal end of the terminal 3 is a pin potion 33 for soldering. A bearing portion 32 is between the main body portion 31 and the pin portion 33. The pin portion 33 of the terminal 3 has a catching portion 331 of through hole type. The inner edge of the catching portion 331 forms an appropriate corner shape to steadily constrict the periphery of the tin ball 4 (with reference to FIG. 7C). Moreover, a trench 35 for facilitating bending of the pin portion 33 can be further disposed between the bearing portion 32 and the pin portion 33 of the terminal 3. After the pin portion 33 is bent, it will be transversal so that the catching portion 331 can catch it from below the tin ball 4. The catching portion 331 can also be used to constrict the periphery of the tin ball 4 (with reference to FIG. 6 or 7C). The bottom end of the tin ball 4 can thus be exposed out, as shown in FIG. 7C.

Figure 10:
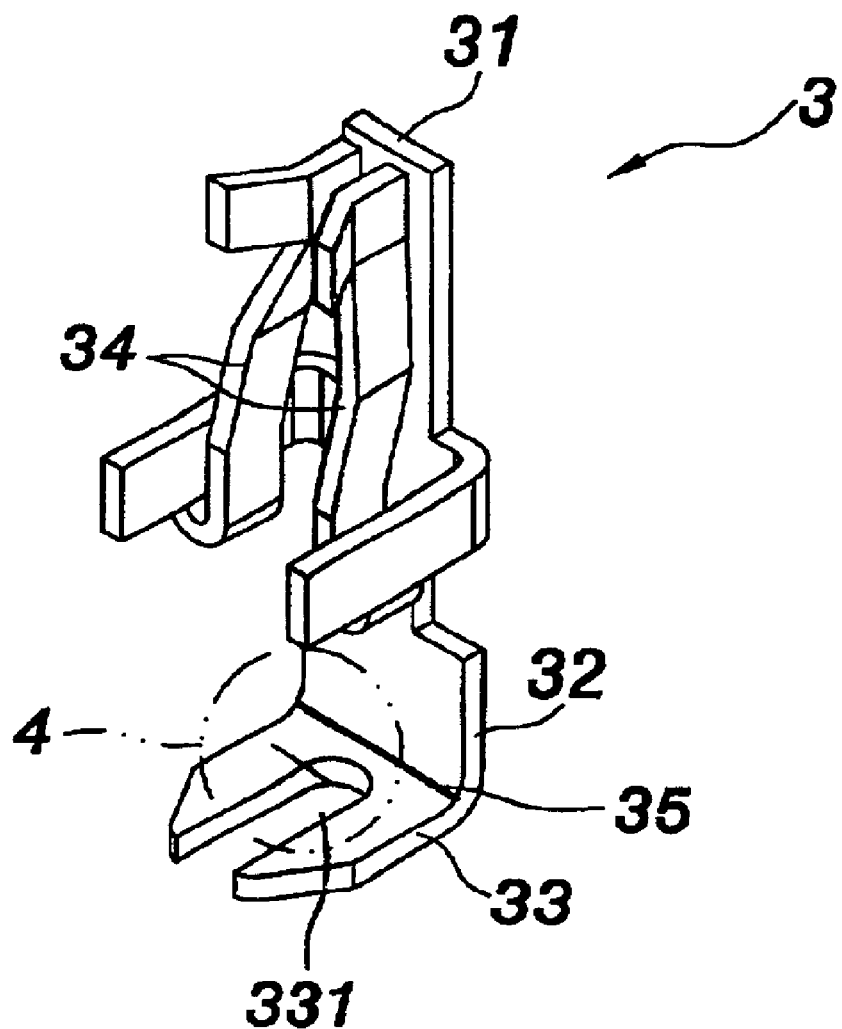
FIG. 10 is a perspective view of a terminal according to another embodiment of the present invention.

As shown in FIG. 10, the catching portion 331 of the terminal 3 of the present invention can also be a rectangular groove with an open side.

Figure 7A:
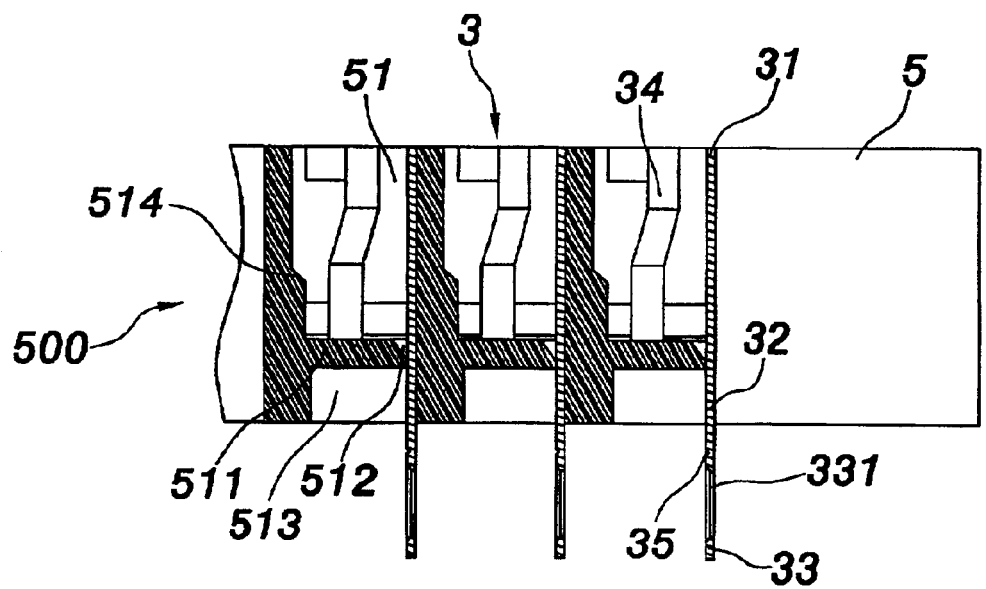
FIG. 7A is a cross-sectional view of an electronic component of the present invention after being installed with terminals.

As shown in FIG. 7A, the cross section of the plastic main body 5 of the electronic component 500 is the rectangular terminal passageway 51, which has a base 511 with an open single side therein. Therefore, the bottom end of the terminal passageway 51 has a bottom receiving room 513 separated by the base 511 and a slit 512 formed at the open single side. After the terminal 3 is installed into the terminal passageway 51, the bearing portion 32 and the pin portion 33 of the terminal 3 will pass through the slit 512 at the open single side of the terminal passageway 51. The bearing portion 32 of the terminal 3 further becomes one wall of the rectangular bottom receiving room 513 to electrically connect the tin ball 4. The pin portion 33 of the terminal 3 protrudes out downwards. A prostrate protuberance 514 can be formed in the terminal passageway 51 and above the base 511.

Figure 7B:
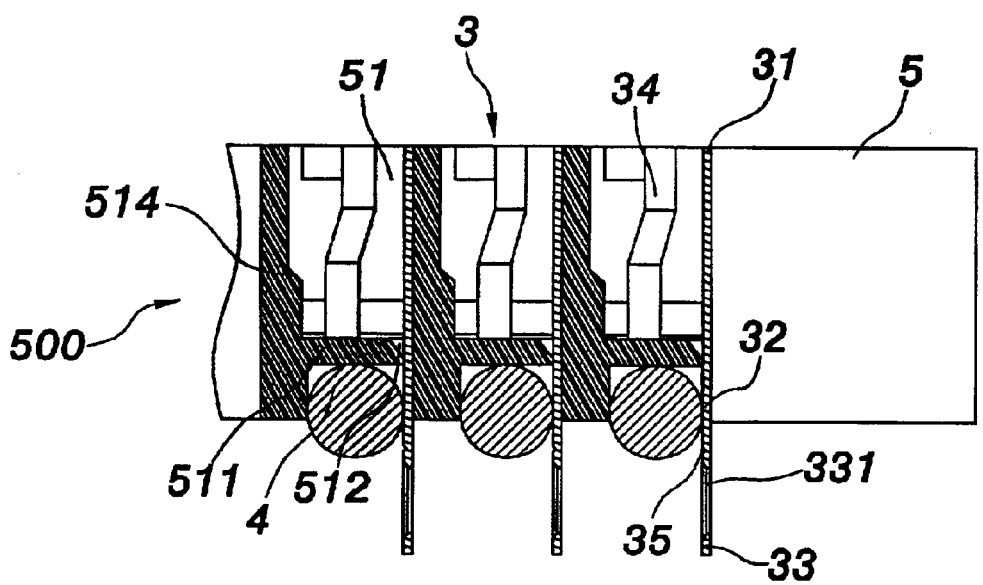
Figure 7C:
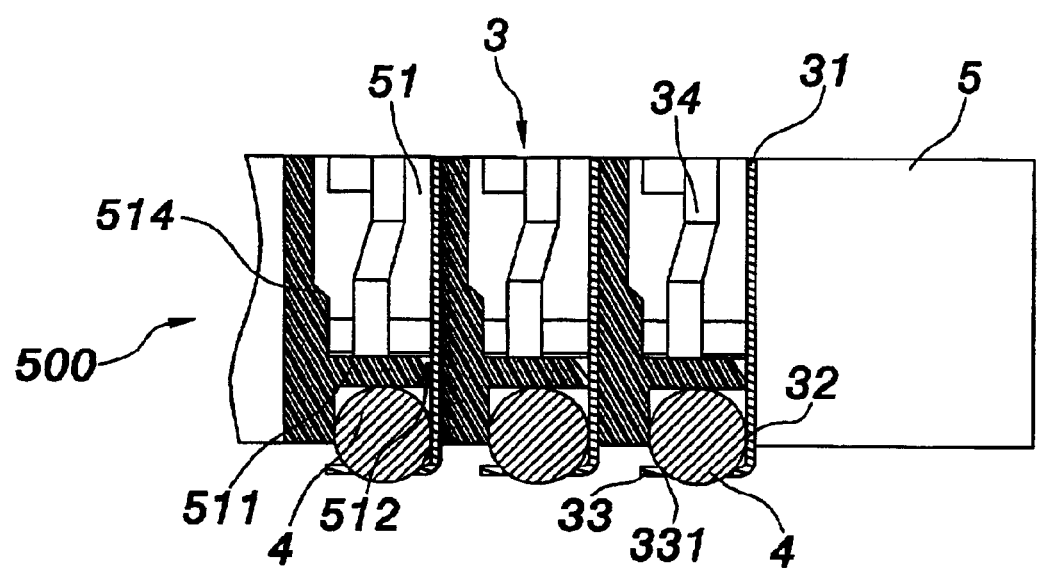
FIG. 7C is a cross-sectional view of FIG. 7B after pin portions of the terminals are bent.

As shown in FIG. 7B, the depth of the bottom receiving room 513 of the plastic main body 5 in the electronic component 5 is just larger than the radius of the implanted tin ball 4, and the bore thereof is just smaller than the diameter of the implanted tin ball 4. It is necessary to use a tool (not shown) for pressing the tin ball 4 into the bottom receiving room 513. The pressed-in tin ball 4 is tightly constricted and will not fall off. Moreover, the pressed-in tin ball 4 tightly contact three walls of the bottom receiving room 513 of the plastic main body 5, the fourth wall of the bottom receiving room 513 of the bearing portion 32 of the terminal 3, and the top wall of the bottom receiving room 513 at the bottom edge of the base 511 so that the bearing portion 32 of the terminal 3 can electrically connect the tin ball 4. Because the tin ball 4 abuts against the bottom edge of the base 511, the coplanarity of the pressed-in tin ball 4 can be controlled.

As shown in FIG. 7C, in practice, a tool (not shown) is moved leftwards at the right side of the electronic component 500 to bend the pin portions 33 of all the terminals 3 one by one according to the positions of the trenches 35. After the pin portions 33 are bent, they can catch the tin balls 4 from below. Because the size of the catching portion 331 is predetermined according to design, the catching portion 331 can exactly constrict the periphery of the tin ball 4, and the bottom end of the tin ball 4 can be exposed out. Moreover, because the catching portion 331 of the pin portion 33 has a corner shape suitable to the periphery of the tin ball 4, it can steadily contact the periphery of the tin ball 4 as in the figure. Because the tin ball 4 contacts the bearing portion 32 of the terminal 3, good electric connection can be achieved between the terminal 3 and the tin ball 4. The electronic component 500 of the present invention is thus formed without passing through a tin oven. The tin balls 4 having exposed bottom ends and uniform heights are formed at the bottom side of the electronic component 500.

Figure 8:
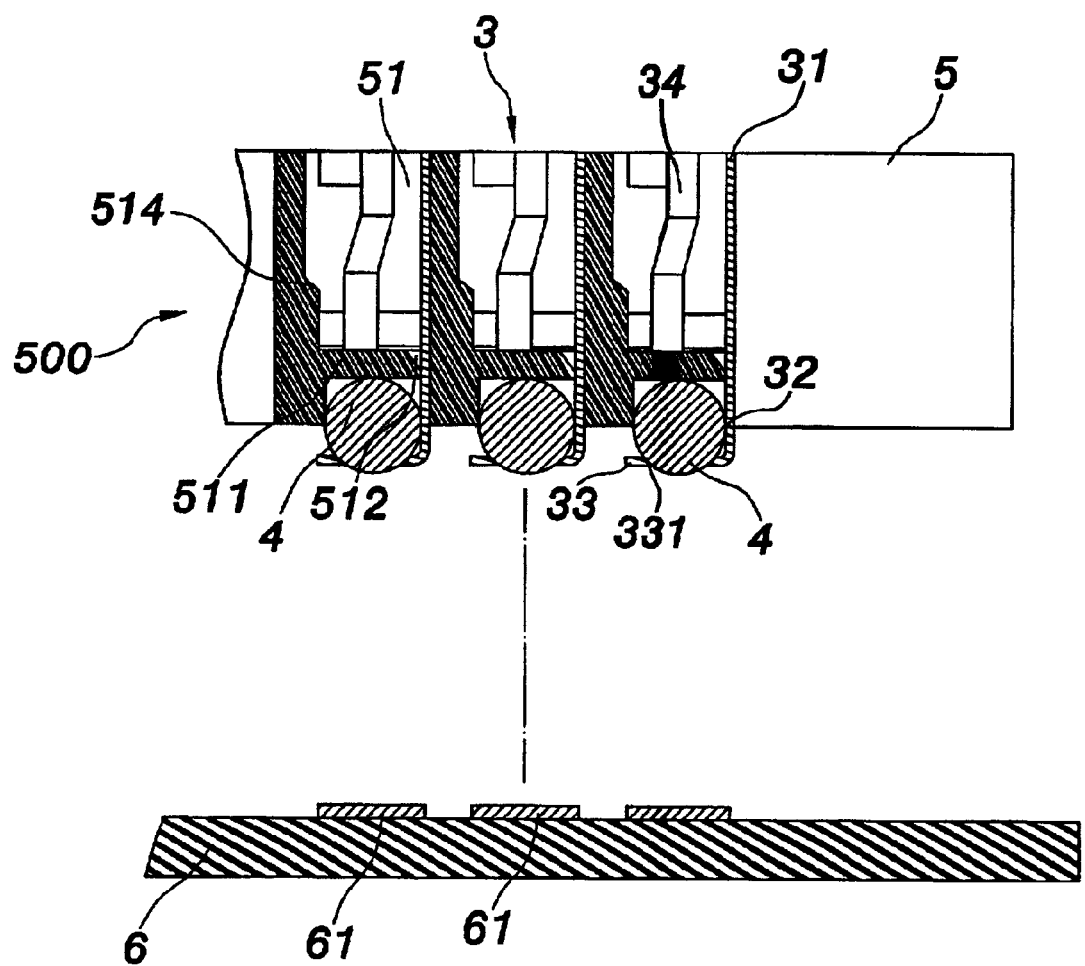
FIG. 8 is a cross-sectional view of an electronic component of the present invention before being soldered to a circuit board.
Figure 9:
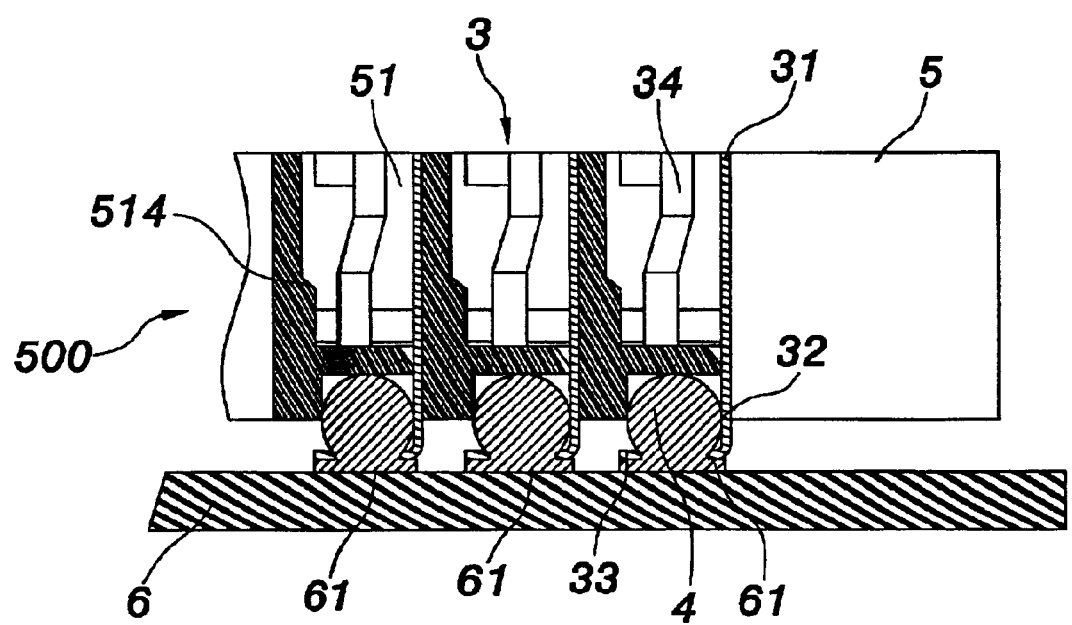
FIG. 9 is a cross-sectional view according to FIG. 8 after the electronic component of the present invention is soldered to a circuit board.

As shown in FIG. 8, because the finished electronic component 500 does not pass through a tin oven, the heights of the tin balls 4 are uniform. Moreover, because the pin portions 33 catch the tin balls 4 from below, and the tin balls 4 are tightly constricted by the bottom receiving rooms 513, the tin balls 4 will be stably unmovable. Therefore, when the electronic component 500 is to be soldered onto a circuit board 6, it is only necessary to paste tin glue to a conductive copper foil 61 on the circuit board 6 for directly placing the electronic component 500 on the circuit board 6. The bottom end of each of the tin balls 4 correspondingly contacts the tin glue on the surface of the conductive copper foil 61. With reference to FIG. 9, when passing through a tin oven, the tin glue of the conductive copper foil 61 can combine with the bottom end portion of the tin balls 4 so as to achieve the object of soldering the electronic component 500 onto the circuit board 6.

Additionally, the above tin ball 4 will not spread upwards so that the soldered circuit board 6 is even. Because the terminal 3 is lengthened by the pin portion 33 so that the length of the terminal 3 is sufficient to be respectively soldered with gold, nickel, and tin. Therefore, tin can be prevented from spreading upwards. Furthermore, the slit 512 of the terminal passageway 51 is very tight so that the terminal 3 will obstruct it after being installed. Therefore, even the terminal 3 is not coated with nickel, tin can be prevented from spreading upwards.

The present invention provides an electronic component 500 capable of forming electric connection with circuits on some devices so as to plug with corresponding electronic products having a plurality of pins. For example, a CPU (an electronic product) having a plurality of pins forms electric connection with a computer motherboard by inserting into a CPU slot (an electronic component). Therefore, the electronic component 500 of the present invention can also be used as an electric connector.

The tin balls 4 are pressed into the bottom receiving rooms 513 and fixed to keep a good degree of coplanarity, and form good contact with the bearing portions 32 of the terminals. After the pin portions 33 of the terminals 3 are bent, the catching portions 331 thereof can catch the bottom periphery of the tin balls 4. Therefore, the packaging of the tin balls can be finished without the electronic component 500 undergoing a procedure of soldering by melting. Because the terminal 3 is lengthened by the pin portion 33 so that the length of the terminal 3 is sufficient to be respectively soldered with gold, nickel, and tin. Therefore, tin can be prevented from spreading upwards. Because the tin balls do not pass through a tin oven, the heights of all the tin balls 4 can be kept uniform. When the electronic component 500 is placed on the circuit board 6 for performing soldering, smooth contact can be achieved to facilitate soldering. Because tin of the tin balls will not spread upwards, the soldered circuit board 6 will be even. Furthermore, because the tin balls 4 are pressed into the bottom receiving rooms 513, the tin balls 4 are fixed and will not fall off. When the electronic component 500 is soldered by melting onto the circuit board 6, because the tin balls abut against the bearing portions 32 of the terminals 3, and the catching portions 331 of the pin portions 33 of the terminals 3 catch the bottom periphery of the tin balls 4, the pin portions 33 of the terminals 3 will be clamped between the tin balls 4 and the conductive copper foil 61 of the circuit board 6 to form a soldered structure of sandwich shape, thereby achieving good electric connection.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. An electronic component having a structure of terminals, said electronic component comprising:
    a plurality of terminals and a plastic main body having a plurality of terminal passageways, a pin portion of each said terminal protruding downwards out of said terminal passageway, said pin portion having a penetrative catching portion, a bottom end of said terminal passageway forming a bottom receiving room for implanting a tin ball, said catching portion of said pin portion of said terminal catching said tin ball from below upon said pin portion being bent;
    said elastic main body having a base formed to extend into said terminal passageway, said base terminating at an open side, said bottom receiving room of said terminal passageway being separated by said base.

2. The electronic component as claimed in claim 1, wherein upon said terminal being installed said terminal passageway, said pin portion of said terminal and a bearing portion between a main body portion and said pin portion pass through the open side of said terminal passageway so that said bearing portion of said terminal forms one wall of said bottom receiving room.

3. The electronic component as claimed in claim 2, wherein a top end of said tin ball in each said bottom receiving room abuts against a bottom edge of said base for preserving coplanarity of adjacent pressed-in tin balls.

4. The electronic component and the structure of terminals thereof as claimed in claim 2, wherein the depth of said bottom receiving room of said plastic main body is just larger than the radius of implanted tin ball, and the bore thereof is just smaller than the diameter of implanted tin ball.

5. The electronic component as claimed in claim 1, wherein said tin ball is tightly constricted and captured in said bottom receiving room.

6. The electronic component as claimed in claim 1, wherein said catching portion of said pin portion of said terminal is formed about a through hole, and an inner edge thereof is chamfered for stably constricting a periphery of said tin ball.

7. The electronic component as claimed in claim 1, wherein said catching portion of said pin portion of said terminal has formed therein a rectangular groove with an open single side.

8. The electronic component as claimed in claim 1, wherein a bearing portion is formed between a main body portion and said pin portion of said terminal, and a trench is disposed between said bearing portion and said pin portion to facilitate bending of said pin portion.

9. The electronic component as claimed in claim 1, wherein said electronic component forms an electric connector.

10. An electronic component comprising:

a plurality of terminals and a plastic main body having a plurality of terminal passageways, a pin portion of each said terminal protruding downwards out of said terminal passageway, said pin portion having a penetrative catching portion, a bottom end of said terminal passageway forming a bottom receiving room for implanting a tin ball, said catching portion of said pin portion of said terminal catching said tin ball from below upon said pin portion being bent;

wherein a bearing portion between a main body portion and said pin portion of said terminal forms a wall for said bottom receiving room, and said pressed-in tin ball is tightly constricted and captured in said bottom receiving room to contact said bearing portion to achieve electric connection.

11. An electronic component comprising:

a plurality of terminals and an insulative main body having a plurality of terminal passageways, a pin portion of each said terminal protruding downwards out of said terminal passageway, said pin portion having a penetrative catching portion, a bottom end of said terminal passageway forming a bottom receiving room for implanting a tin ball, said catching portion of said pin portion of said terminal catching said tin ball from below upon said pin portion being bent;

wherein a bearing portion between a main body portion and said pin portion of said terminal forms a wall for said bottom receiving room, and said pressed-in tin ball is tightly constricted and captured in said bottom receiving room to contact said bearing portion to achieve electric connection.

* * * * *